United States Patent [19]

Hotta et al.

[11] Patent Number: 4,549,166

[45] Date of Patent: Oct. 22, 1985

[54] DIGITAL-TO-ANALOG CONVERTER USING A FEEDBACK ELEMENT MATCHING TECHNIQUE

[75] Inventors: Masao Hotta, Hachioji; Kenji Maio, Tokyo; Hiromi Nagaishi, Nagasaki, all of Japan

[73] Assignee: Hitachi, Ltd., Tokyo, Japan

[21] Appl. No.: 361,437

[22] Filed: Mar. 24, 1982

[30] Foreign Application Priority Data

Mar. 25, 1981 [JP] Japan .................................. 56-42312
Feb. 3, 1982 [JP] Japan .................................. 57-14987
Feb. 3, 1982 [JP] Japan .................................. 57-14988

[51] Int. Cl.$^4$ ........................................... H03K 13/02
[52] U.S. Cl. ...................... 340/347 DA; 340/347 CC; 340/347 M
[58] Field of Search ....... 340/347 M, 347 CC, 347 C, 340/347 DA, 347 AD

[56] References Cited

U.S. PATENT DOCUMENTS 3,217,147 11/1965 Chapman, Jr. .......... 340/347 DA X
4,369,432 1/1983 Mikami ...................... 340/347 M X Primary Examiner—T. J. Sloyan
Attorney, Agent, or Firm—Antonelli, Terry and Wands

[57] ABSTRACT

The present invention is characterized that a digital-to-analog converter having ordinal accuracy and one or more current sources are combined and the output currents of the current sources are accurately controlled to have a predetermined relationship with regard to the reference current which is a full-scale value of the analog output current of DAC so that the output current of the current sources designated by bits added to the superior bit of the digital input signal depending on the number of the current sources and the analog output current in response to the digital input signal with the added bits are added to produce an analog signal corresponding to the digital input signal.

4 Claims, 18 Drawing Figures

DIGITAL-TO-ANALOG CONVERTER USING A FEEDBACK ELEMENT MATCHING TECHNIQUE

The present invention relates to a digital-to-analog converter (hereinafter referred to as DAC) with high accuracy and which is suitable for an integrated circuit in its monolithic form.

In prior art DAC, it is general practice that the currents weighted by a weighted network such as an R-2R resistance ladder network are selected in response to the digital input signal and added to each other to obtain an analog output signal depending on the digital input signal.

However, in the case where such a DAC is formed of the integrated circuit in its monolithic form, the accuracy (although it is also called linearity, it is hereinafter referred to as accuracy) of DAC is limited to about 9–10 bits due to linearity error of the weight network on the basis of dispersion of resistance elements in the ladder network. In order to further increase the accuracy, the dispersion of the resistance elements has been narrowed by using a technique such as trimming. However, there is a drawback that manufacturing stages of DAC are complicated since a new trimming stage is added and consequently the achievable accuracy of DAC is limited to 14–16 bits.

Therefore, it is an object of the present invention to provide a digital-to-analog converter with high accuracy of 18 bits or more and which is suitable for the integrated circuit in its monolithic form, without the technique such as trimming.

In order to achieve the object, the circuit of the present invention is so constituted that DAC having ordinary accuracy and one or more current sources are combined and the output current of said current sources are accurately controlled to maintain a predetermined relationship with the reference current which is obtained from an additional output of the DAC having the ordinary accuracy so as to add the output current of the current sources designated by bits added to the superior bit of the digital input signal depending to the number of the current sources and the analog output current depending on the digital input signal without the bits added to the superior bit.

Consequently, the accuracy of DAC is improved by the number of the bits added to the superior bit.

FIG. 1 is a circuit block diagram for showing the principle of the present invention. The principle of the present invention will be explained with reference to the circuit diagram.

In FIG. 1, in order to increase the accuracy of DAC 1 having the accuracy of about 9 bits (explanation will be hereinafter made to DAC which has the accuracy of 9 bits) by N bits substantially, current circuits composed of predetermined numbers of current sources 11, 12, .., 14 depending on N and switches 31, 32, ..., 34 connected in series to the respective current sources are connected in parallel with the DAC 1, the current thereof being fixed to twice that of current controlled by the most significant bit of the 9 bits and the output currents $I_1, I_2, \ldots, I_4$ of the respective current sources is accurately controlled by a control circuit 2 to have a predetermined value with regard to the maximum output current $I_0$ of the DAC 1 so that the switches 31, 32, ..., 34 are opened or closed by the superior N bits of the digital input signal. Consequently, an analog output current $I_A$ with regard to the digital input signal composed of (N+9) bits can be obtained from a terminal 101 as a sum of the output current of DAC 1 and the output currents of the current sources selected by the switches.

According to the present invention, DAC with high accuracy and which is suitable for the integrated circuit in its monolithic form can be realized with a simple circuit constitution, producing large effect.

The present invention will be described in detail with reference to the accompanying drawings in which:

FIG. 2b illustrates an output waveform of a current source in DAC of FIG. 2a;

FIG. 3 is a practical circuit diagram of DAC of FIG. 2a;

Figure 1:
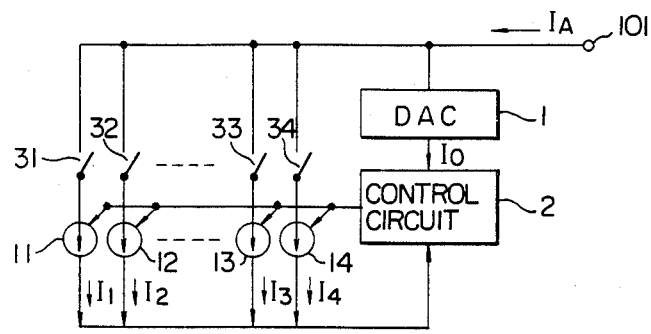
FIG. 1 is a circuit block diagram for illustrating a principle of DAC of the present invention.

The present invention will now be described in detail with reference to the embodiments Referring to FIG. 2a in which a circuit diagram of DAC according to the first embodiment of the present invention is shown, one current source 11 is connected in parallel with DAC 1 as shown in FIG. 1. A control circuit 2 is controlled so that an output current $I_1$ of the current source 11 is equal to a maximum output current $I_0$ of DAC 1. There is realized a DAC having improved accuracy by N (=1) bits as compared with a single DAC 1.

Figure 2A:
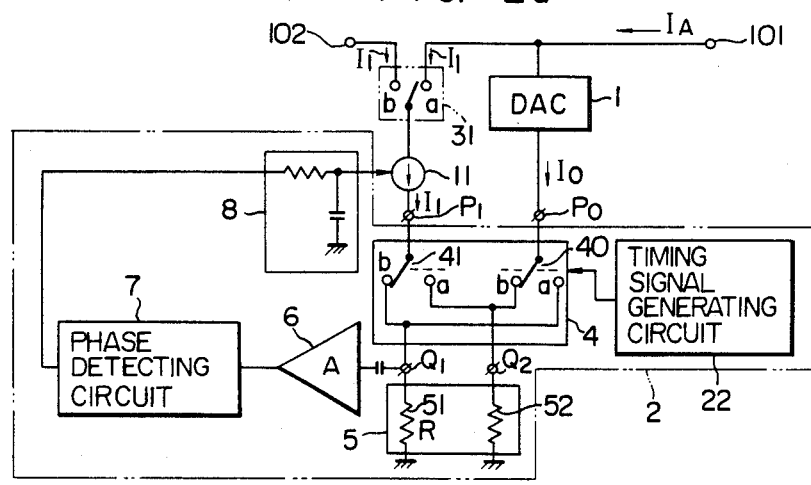
FIG. 2a is a circuit block diagram of DAC according to a first embodiment of the present invention.

In FIG. 2a, when a superior bit of a digital input signal is a logic "1", a switch 31 is connected to a terminal a and the output current $I_1$ of the current source 11 is supplied to a change-over switch circuit 4 through a terminal 101 and the switch 31. When the superior bit is a logic "0", the output current $I_1$ of the current source 11 is supplied to the change-over switch circuit 4 through a terminal 102 and a terminal b of the switch 31. The two output currents $I_0$ and $I_1$ are supplied to input terminals $P_0$ and $P_1$ of the change-over switch circuit 4, respectively. The change-over switch circuit 4 further contains two output terminals $Q_1$ and $Q_2$ connected between the input terminals $P_0$ and $P_1$ and the output terminals $Q_1$ and $Q_2$ alternately. The change-over switch circuit 4 is provided with two change-over switches 40 and 41 connected to the input terminals $P_0$ and $P_1$, respectively. A terminal a of the change-over switch 40 and a terminal b of the change-over switch 41 are commonly connected to the output terminal $Q_1$. A terminal b of the change-over switch 40 and a terminal a of the change-over switch 41 are commonly connected to the output terminal $Q_2$. The change-over switches 40 and 41 in the change-over switch circuit 4 are turned by a predetermined timing signal generated from a timing signal generating circuit 22 in the control circuit 2 to connect between the input terminals $P_0$ and $P_1$ and the output terminals $Q_1$ and $Q_2$ alternately. Thus, each of the output currents $I_0$ and $I_1$ is alternately supplied to a current detecting resistor 51 or 52 in a resistor circuit 5 through the output terminal $Q_1$ or $Q_2$.

Suppose that the resistance value of the resistor 51 is R. When both the change-over switches 40 and 41 are connected to the respective terminal a, the current $I_0$ is supplied to the resistor 51 through the output terminal $Q_1$ to produce a voltage $R \cdot I_0$ at the terminal $Q_1$ and the current $I_1$ is supplied to the resistor 52 through the output terminal $Q_2$. When both the change-over switches 40 and 41 are connected to the respective terminal b, the current $I_1$ is supplied to the resistor 51 through the output terminal $Q_1$ to produce a voltage $R \cdot I_1$ at the terminal $Q_1$ and the current $I_0$ is supplied to the resistor 52 through the output terminal $Q_1$.

Figure 2B:
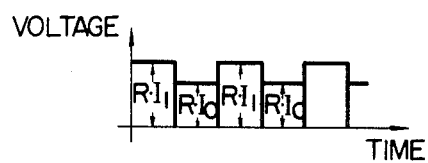

If $I_0 \neq I_1$, a difference is caused between the voltages $R \cdot I_0$ and $R \cdot I_1$ as shown in FIG. 2b.

In the embodiment shown in FIG. 2a, the current $I_1$ is accurately controlled so that it becomes equal to the current $I_0$ which is the reference current.

Actually, the voltage signal produced at the terminal $Q_1$ and shown in FIG. 2b is amplified by an alternating current amplifier circuit 6 to be synchronously rectified by a phase sensitive detector 7 and a low-frequency component of the voltage signal is detected by a low-pass filter circuit 8 composed of, for example, a resistor and a capacitor so that the output current $I_1$ of the current source 11 is changed by the detected low-frequency component and controlled to be equal to the current $I_0$.

Suppose that the gains of the alternating current amplifier circuit 6, the phase sensitive detector 7 and the low-pass filter circuit 8 are A, $\alpha$ and $\beta$, respectively, and the output voltage of the low-pass filter circuit 8 is Vg. The output voltage Vg is given by:

$$Vg = A \cdot \alpha \cdot \beta \cdot R \cdot (I_1 - I_0) \qquad (1)$$

The current $I_1$ is composed of the fixed part ($I_s$) which is independent of Vg and the change part ($G_m \cdot Vg$) caused by Vg. The current $I_1$ is given by:

$$I_1 = I_s + g_m \cdot Vg \qquad (2)$$

(where $g_m$ is constant).

From the equations (1) and (2), the relative difference ($\Delta I/I_0$) of $I_0$ and $I_1$ which is expressed by the ratio of $\Delta I = I_1 = I_0$ to $I_0$ is approximately given by:

$$\Delta I/I_0 \cong -(I_s/I_0 - 1)/(A \cdot \alpha \cdot \beta \cdot g_m \cdot R) \qquad (3)$$

Taking the accuracy of elements in the integrated circuit into consideration, ($I_s/I_0 - 1$) can be about $10^{-3}$ (0.1%) and ($A \cdot \alpha \cdot \beta \cdot g_m \cdot R$) can be about $10^3$. Therefore, the value of the equation (2) is as follows:

$$\Delta I/I_0 \cong 10^{-6} (\cong 2^{-20})$$

Accordingly, the current $I_1$ can be theoretically controlled to be equal to the current $I_0$ with accuracy of about 20 bits.

Figure 3:
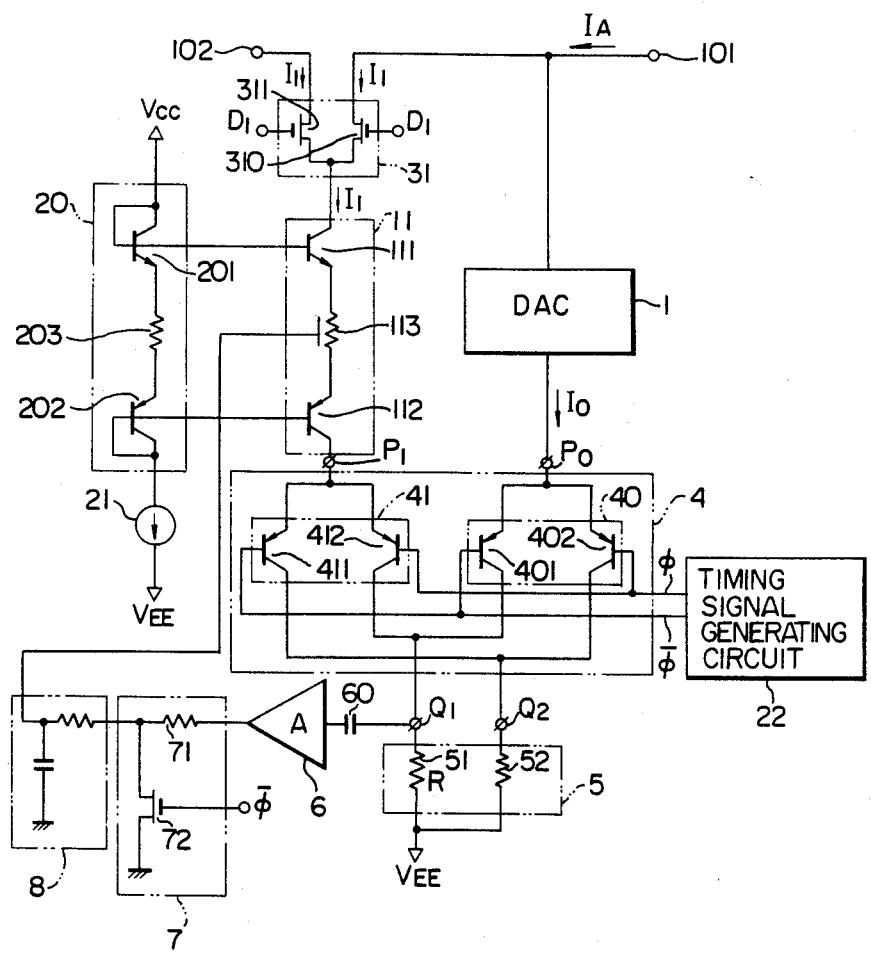

FIG. 3 exemplifies a practical circuit diagram of the current source 11, the change-over switch circuit 4 and the phase sensitive detector 7 in FIG. 2a according to the embodiment of the present invention.

In FIG. 3, the circuits corresponding to each circuit block of FIG. 2a are given like reference numbers of FIG. 2a, respectively. $V_{cc}$ and $V_{EE}$ are direct current bias voltages.

The current source 11 contains an NPN transistor 111, a PNP transistor 112 and a variable resistor 113 connected between both emitters of the transistors 111 and 112.

With such a constitution, there can be realized the floating current source for the load side of the switch circuit 31 which is turned on and off by the digital input signal and the side of the change-over switch circuit 4.

In this case, the output current $I_1$ can be changed by varying the resistance value of the variable resistor 113. The variable resistor can be realized by utilizing the stray MOS effect of the diffused resistance of an integrated circuit where the diffused resistance is coupled through an oxide layer to an electrode to which the output voltage of the low-pass filter 8 is applied to change its resistance value depending on the voltage value of the output value or by utilizing the resistivity change caused by island potential leak in the resistance. Furthermore, a FET may be used instead of the resistor.

A circuit 20 for driving the current source 11 comprises transistors 201 and 202 having the same characteristics, respectively, as the transistors 111 and 112 of the current source 11 and a resistor 203 connected between both emitters of the transistors 201 and 202. The circuit 20 is connected to a current source 21 in series so as to supply the transistors 111 and 112 with a constant current independently of variation of the voltage between the base and the emitter of the transistors 111 and 112.

When either gate 310 or 311 of the switch circuit 31 is turned on depending on a polarity of one superior bit ($D_1$) of the digital input signal, the output current $I_1$ of the current source 11 is supplied to the change-over switch circuit 4 through a terminal 101 or 102.

The change-over switch circuit 4 is composed of a switching circuit 41 including transistors 411 and 412 which are turned on and off by timing signals $\phi$ and $\overline{\phi}$ generated from a timing signal generating circuit 22 and a switching circuit 40 including transistors 401 and 402 which are also turned on and off by the timing signals $\phi$ and $\overline{\phi}$. The emitters of the transistors 401 and 402 are commonly connected to the input terminal $P_0$ and the emitters of the transistors 411 and 412 are also commonly connected to the input terminal $P_1$. The collectors of the transistors 401 and 412 are connected to the output terminal $Q_1$ and the collectors of the transistors 402 and 411 are connected to the output terminal $Q_2$. The timing signal $\phi$ is supplied to the bases of the transistors 402 and 412 while the timing signal $\overline{\phi}$ is supplied to the bases of the transistors 401 and 411.

Consequently, the transistors are turned on and off depending on the polarity of the timing signals $\phi$ and $\overline{\phi}$ so that each of the input terminals $P_0$ and $P_1$ is alternately connected to each of the output terminals $Q_1$ and $Q_2$. Thus, the currents $I_o$ and $I_1$ are alternately supplied to resistors 51 and 52. A voltage drop generated across the resistor 51 is supplied to the alternating current amplifier circuit 6 through a capacitor 60.

The phase sensitive detector 7 is composed of a serial resistor 71 connected between the input and the output of the phase sensitive detector and a MOS transistor 72 connected between the output and the ground and turned on and off by the timing signal $\overline{\phi}$.

In FIG. 3, the PNP transistors used in the current source 11 and the change-over switch circuit 4 may be substituted with P channel FETs while the NPN transistors may be also substituted with N channel FETs.

Although FIGS. 2 and 3 show the embodiment where one current is controlled to be equal to the reference current, another embodiment will be described where the n ($n \geq 2$) numbers of currents are controlled to be equal to the reference current.

For clarification of explanation, the embodiment in the case of n=3 will be described. However, it may be achieved in the same manner in the case of n=2 and n>3.

Figure 4:
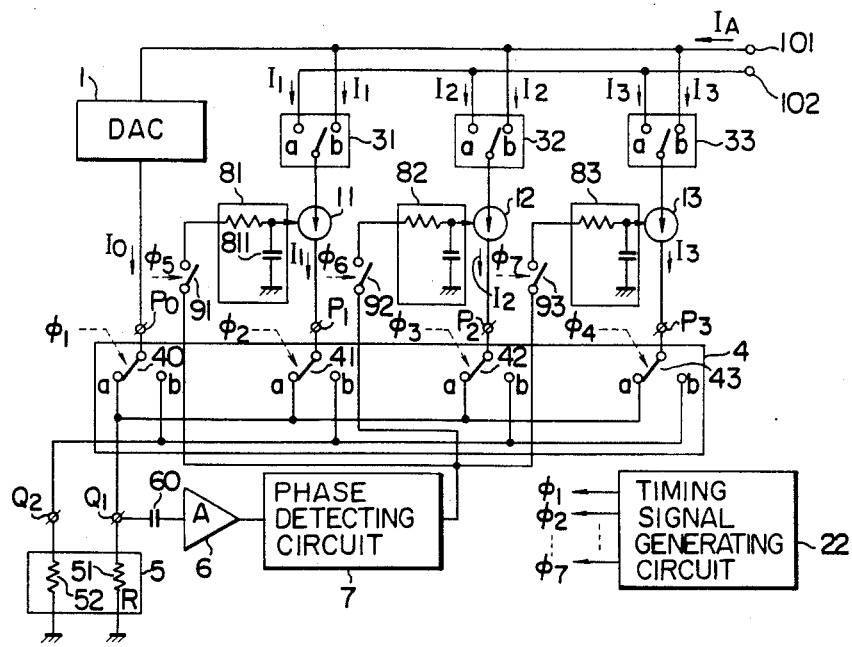
FIG. 4 is a circuit diagram of DAC according to a second embodiment of the present invention.

FIG. 4 shows a circuit diagram according to a second embodiment of the present invention which corresponds to the circuit in the case of n=3.

The change-over switch circuit 4 includes an input terminal $P_0$ supplied with the output current $I_0$ of DAC 1, three input terminals $P_1$, $P_2$ and $P_3$ supplied with the output currents $I_1$, $I_2$ and $I_3$ of three current sources 11, 12 and 13, respectively, and two output terminals $Q_1$ and $Q_2$ connected to the resistors 51 and 52 in the resistor circuit 5, respectively. The change-over switch circuit is composed of four switching circuits 40–43 connected to the input terminals $P_0$–$P_3$, respectively. The terminal a of each switching circuit is commonly connected to the output terminal $Q_1$ which the terminal b is also commonly connected to the output terminal $Q_2$.

These switching circuits are switched by the timing signals $\phi_1$–$\phi_4$ from the timing signal generating circuit 22 and establishes a connecting pattern between the input terminals $P_0$–$P_3$ and the output terminals $Q_1$ and $Q_2$.

Figure 5:
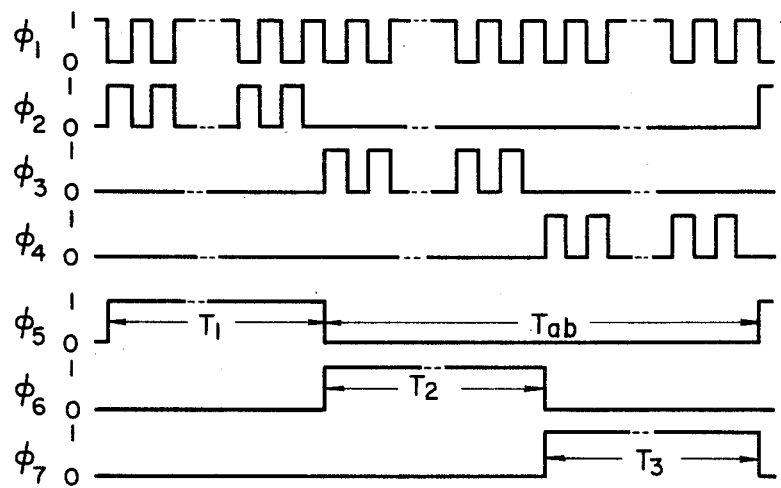
FIG. 5 is a timing chart of timing signals used in DAC of FIG. 4.

FIG. 5 shows a timing chart of the timing signals $\phi_1$–$\phi_7$ generated by the timing signal generating circuit 22. Operation of FIG. 4 will be described by using FIG. 5.

In FIG. 4, the switching circuits 40–43 of the change-over switch circuit 4 are connected to the terminals a, respectively, when the timing signals $\phi_1$–$\phi_4$ are in the logic "1" and connected to the terminals b, respectively, when the timing signals are in the logic "0". Switches 91–93 which are disposed between the phase sensitive detector 7 and each low-pass filter circuit 81, 82 or 83 are closed when the timing signals $\phi_5$–$\phi_7$ are in the logic "1" and are opened when the timing signals $\phi_5$–$\phi_7$ are in the logic "0".

During the time period $T_1$ when the timing signal $\phi_5$ of FIG. 5 is in the logic "1", the switch 91 is closed to select the low-pass filter circuit 81. The switching circuits 40 and 41 are alternately connected to the terminals a and b, respectively, depending on the polarity of the timing signals $\phi_1$ and $\phi_2$ so that each of the input terminals $P_0$ and $P_1$ is alternately connected to each of the output terminals $Q_1$ and $Q_2$. Consequently, the reference current $I_0$ and the output current $I_1$ of the current source 11 alternately flow through the resistors 51 and 52 in the resistance circuit 5, respectively. The voltage drop across the resistor 51 is fed back to the circuit source 11 through the feedback circuit composed of the capacitor 60, the phase sensitive detector 7 and the low-pass filter circuit 81 so that the variable resistor in the current source 11 is so controlled that the current $I_1$ becomes equal to the current $I_0$.

During the time period $T_2$ when the timing signal $\phi_6$ of FIG. 5 is in the logic "1" after the time period $T_1$, the switch 92 is closed to select the low-pass filter circuit 82. The switch circuits 40 and 42 are alternately connected to the terminals a and b, respectively, depending on the polarity of the timing signals $\phi_1$ and $\phi_3$ so that each of the input terminals $P_o$ and $P_2$ is alternately connected to each of the output terminals $Q_1$ and $Q_2$. Consequently, the currents $I_o$ and $I_2$ alternately flow through the resistors 51 and 52, respectively. In the same manner as described above, the variable resistor in the current source 12 is so controlled that the current $I_2$ becomes equal to the current $I_o$.

During the time period $T_3$ when the timing signal $\phi_7$ of FIG. 5 is in the logic "1" after the time period $T_2$, the switch 93 is closed to select the lowpass filter circuit 83. The switching circuit 40 and 43 is alternately connected to the terminals a and b, respectively, depending on the polarity of the timing signals $\phi_1$ and $\phi_4$ so that each of the input terminal $P_o$ and $P_3$ is alternately connected to each of the output terminals $Q_1$ and $Q_2$. Consequently, the currents $I_o$ and $I_3$ alternately flow through the resistors 51 and 52, respectively, so that the variable resistor in the current source 13 is so controlled that the current $I_3$ becomes equal to the current $I_o$ in the same manner as described above. One complete cycle has been completed at the end of the time period $T_3$. Next, the cycle will be returned to the first state and be repeated in the same manner as described above.

Therefore, in the above embodiment, the changeover switch circuit 4 sequentially selects one terminal $P_i$ (i=1, 2 and 3) from the three terminals $P_1$, $P_2$ and $P_3$ connected to the three current sources 11, 12 and 13, respectively, in response to the time period $T_1$, $T_2$ or $T_3$ determined by the timing signals $\phi_5$, $\phi_6$ and $\phi_7$ within the cycle time. Further, the change-over switch circuit 4 alternatively connects each of the selected input terminal $P_i$ and the input terminal $P_o$ connected to DAC 1 with the two output terminals, within each time period $T_1$, $T_2$ or $T_3$. Accordingly, the change-over switch circuit 4 sets up the above connecting patterns between the four input terminals $P_o$–$P_3$ and the two output terminals $Q_1$ and $Q_2$.

Further, it is necessary to hold the output of the low-pass filter circuit 81 during the time period $T_{ab}$ until the low-pass filter circuit 81 is selected again after the low-pass filter circuit 81 is selected in the time period $T_1$ of FIG. 5. Therefore, it is necessary to sufficiently reduce the leak through the switch 91 and the current source 11 of the charge accumulated in the capacitor 811 of the low-pass filter circuit 81. For this purpose, the time period $T_{ab}$ is required to be sufficiently small as compared with the discharge time constant of the capacitor 811.

The change-over switches 40–43 and the current sources 11–13 can be realized with the same constitution as that of FIG. 3.

With the constitution of FIG. 4, from DAC 1 having accuracy of 9 bits, there can be realized a DAC having accuracy of 9+2=11 bits in view of from the output terminal 101.

The switches 31, 32 and 33 are connected to the terminal a or b in response to the polarity of the digital input signal of which predetermined lower bits (for example, 9 bits) supplied to DAC 1 are removed so that the output currents $I_1$, $I_2$ and $I_3$ of the current sources 11, 12 and 13 are supplied to the change-over switch circuit 4 through the terminal 101 or 102.

In order to improve the accuracy by N bits by using the method as described in FIG. 4, $n=(2^N-1)$ numbers of current sources are required. By way of example, in order to a DAC with accuracy of 18 bits by increasing accuracy of the DAC 1 by 9 bits, $2^9-1=511$ numbers of current sources are required and there may be a problem with regard to mounting thereof.

Figure 6:
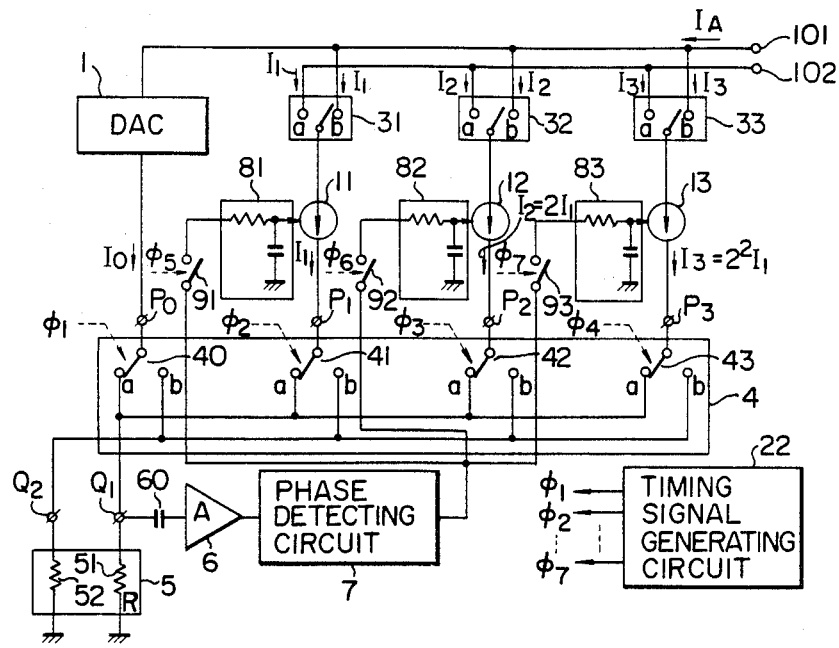
FIG. 6 is a circuit diagram of DAC according to a third embodiment of the present invention.

FIG. 6 shows a circuit diagram of a third embodiment according to the present invention in which the above problem in the embodiment of FIG. 4 is solved.

Although the circuit constitution of the embodiment in FIG. 6 is the same as that of the embodiment in FIG. 4, the output currents of the current sources 11, 12 and 13 are controlled so that the binary weighted currents of $I_1$, $2I_1$ and $2^2I_1$ are obtained as the output currents of the current sources 11, 12 and 13, respectively. Consequently, the accuracy of DAC 1 can be increased by 3 bits while using the three current sources. Therefore, according to this method, when N numbers of current sources are used and the output currents of the current sources are controlled to be equal to $I_1$, $2I_1$, $2^2I_1$, ..., and $2^{N-1}I_1$, respectively, the accuracy of DAC 1 can be increased by N bits. For example, 511 numbers of current sources are required in the case of the embodiment of FIG. 4 in order to increase the accuracy by N bits, while only 9 numbers of current sources are required in the case of the embodiment of FIG. 6.

Figure 7:
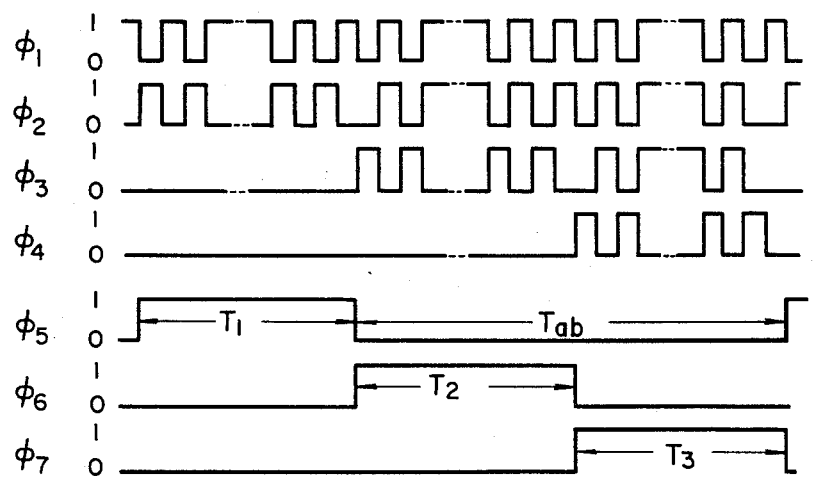
FIG. 7 is a timing chart of timing signals used in DAC of FIG. 6.

FIG. 7 shows a timing chart of the timing signals $\phi_1$-$\phi_7$ produced by the timing signal generating circuit 22 in FIG. 6. Operation of the circuit in FIG. 6 will be described with reference to FIG. 7.

In FIG. 6, relationship between operation of change-over switches 40-43 and switches 91-93 and the polarity of the timing signals $\phi_1$-$\phi_7$ is the same as that of FIG. 4.

In the same manner as in the case of FIGS. 4 and 5, switches 31, 32 and 33 are connected to the terminal a or b, respectively, in response to the polarity of the digital input signal. During the time period $T_1$ of FIG. 7, the switch 91 is closed to select the low-pass filter circuit 81. The change-over switches 40 and 41 are alternately connected to the terminal a or b depending on the polarity of the timing signals $\phi_1$ and $\phi_2$ so that each of the input terminals $P_o$ and $P_1$ is alternately connected to each of the output terminals $Q_1$ and $Q_2$. Consequently, the reference current $I_o$ and the output current $I_1$ of the current source 11 are alternately detected as a terminal voltage of the resistor 51. The terminal voltage is fed back to the current source 11 through a feedback circuit composed of the capacitor 60, the phase sensitive detector 7 and the low-pass filter circuit 81, so that the variable resistor in the current source 11 is so controlled that the output current $I_1$ is equal to the reference current $I_o$.

The output of the low-pass filter circuit 81 is held over the time period $T_{ab}$ after the time period $T_1$ of FIG. 7.

In the following time period $T_2$, the switch 91 is opened and the switch 92 is closed to select the low-pass filter circuit 82. The output of the phase sensitive detector 7 is disconnected from the low-pass filter circuit 81 and connected to only the low-pass filter circuit 82 so that the output current $I_2$ ($=2I_1$) of the current source 12 is controlled to be equal to $I_o+I_1=2I_o$. In the other words, since the output of the low-pass filter circuit 81 is held in the time period $T_2$ from the preceding time period $T_1$, the output current $I_1$ of the current source 11 is maintained to be equal to the reference current $I_o$. While a condition where when the timing signals $\phi_1$ and $\phi_2$ in phase are in the logic "1" (at this time, the timing signal $\phi_3$ is in the logic "0") the change-over switches 40 and 41 are connected to the terminal a and the input terminals $P_o$ and $P_1$ are connected to the output $Q_1$ so that the current of $I_o+I_1=2I_o$ is supplied to the resistor 51 and a condition where when the timing signal $\phi_3$ is in the logic "1" (at this time, the timing signals $\phi_1$ and $\phi_2$ are in the logic "0") the change-over switch 42 is connected to the terminal a and the input terminal $P_2$ is connected to the output terminal $Q_1$ so that the output current $I_2$ ($=2I_1$) of the current source 12 is supplied to the resistor 51 are alternately repeated, the terminal voltage of the resistor 51 is fed back to the current source 12 in the same manner as described above and the variable resistor in the current source 12 is controlled so that the output current $I_2$ ($=2I_1$) is equal to $2I_o$.

The output of the low-pass filter circuit 82 is held during the time until the timing signal $\phi_6$ will become to the logic "1" after the time period $T_2$ of FIG. 7.

Furthermore, during the following time period $T_3$, the switches 91 and 92 are opened and the switch 93 is closed to select the low-pass filter circuit 83. The output of the phase sensitive detector 7 is disconnected from the low-pass filter circuit 82 and connected to the low-pass filter circuit 83. The output current $I_3$ ($=2^2I_1$) of the current source 13 is controlled to be equal to the value of $I_o+I_1+2I_1=2^2I_o$.

In the time period $T_3$, since the outputs of the low-pass filter circuits 81 and 82 are held from the time periods $T_1$ and $T_2$, respectively, the output current $I_1$ of the current source 11 is equal to $I_o$ and the output current $I_2$ of the current source 12 is equal to $2I_o$, continuously. Therefore, while a condition where the change-over switches 40, 41 and 42 are connected to the respective terminals a and the input terminals $P_o$, $P_1$ and $P_2$ are connected to the output terminal $Q_1$ so that the current of $I_o+I_1+2I_1=2^2I_o$ flows through the resistor 51 when the timing signals $\phi_1$, $\phi_2$ and $\phi_3$ in phase are in the logic "1" (at this time, $\phi_4$ is in the logic "0") and a condition where the change-over switch 43 is connected to the terminal a and the input terminal $P_3$ is connected to the output terminal $Q_1$ so that the output current $I_3$ ($=2^2I_1$) of the current source 13 is supplied to the resistor 51 when the timing signal $\phi_4$ is in the logic "1" (at this time, $\phi_1$, $\phi_2$ and $\phi_3$ are in the logic "0") are alternately repeated, the terminal voltage of the resistor 51 is fed back to the current source 13 in the same manner as described above and the variable resistor in the current source 13 is controlled so that the output current $I_3$ ($=2^2I_1$) is equal to $2^2I_o$. One complete cycle period is composed of the time periods $T_1$, $T_2$ and $T_3$.

As described above, in the present embodiment, the change-over switch circuit 4 sequentially selects one input terminal $P_i$ ($i=1, 2, 3$) from the three input terminals $P_1$, $P_2$ and $P_3$ in response to the time period $T_1$, $T_2$ or $T_3$ determined by the timing signal $\phi_5$, $\phi_6$ or $\phi_7$, respectively, in the cycle time. Further, the changeover switch circuit 4 alternately connects each of the selected input terminal $P_i$ and the input terminal $P_o$ with each of the output terminals $Q_1$ and $Q_2$ within each time period and connects the input terminal $P_{i-1}$ which is selected prior to the selected input terminal $P_i$ within the cycle time with the same output terminal as the output terminal to which the input terminal $P_o$ is connected. Accordingly, the change-over switch circuit 4 sets up the above connecting pattern between the input terminals $P_0$–$P_3$ and the output terminals $Q_1$ and $Q_2$.

By expanding the method of FIG. 6, it is easy to obtain the binary weighted current which is equal to $2^{N-1}$ times of current by using N (N>3) numbers of current sources.

Further, in order to obtain the output current of $2^N I_1$, the resistance value corresponding to the variable resistor 113 in the current source 11 may be $1/2^N$ with regard to the output current of $2^N I_1$.

Figure 8:
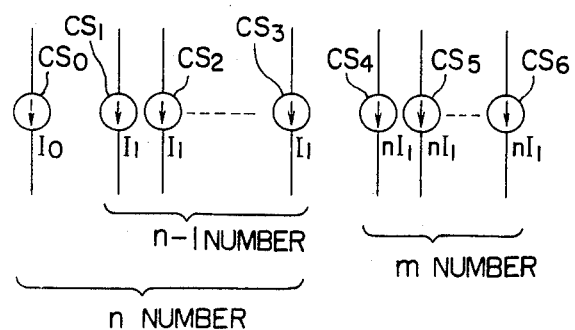
FIG. 8 is a model diagram which exemplifies one application of the present invention.

When the method of FIGS. 4 and 6 is utilized, as shown in FIG. 8, the output current $I_o$ of the current source $CS_o$ is the reference current and if the output currents $I_1$ of (n−1) numbers of current sources $CS_1$, $CS_2$, ..., $CS_3$ is sequentially controlled to be equal to $I_o$, respectively, n numbers of current sources of which output currents are equal to each other can be obtained.

Further, in order to obtain $nI_1 = nI_o$ where the output currents for m numbers of current sources $CS_4$, $CS_5$, ..., $CS_6$ are given by $nI_1$ on the basis of the above results, the total sum of $I_o + I_o + \ldots + I_o = nI_o$ for the output currents of the current sources $CS_0$–$CS_3$ is obtained to supply the current sources $CS_4$, $CS_5$, ..., $CS_6$ with the signal corresponding to $nI_o$ and the variable resistor in the respective current sources $CS_4$, $CS_5$, ..., $CS_6$ may be controlled so that the respective output currents are equal to $nI_o$.

In the above embodiment shown in FIG. 6, since the resistor 51 for comparing the currents is constant, the terminal voltage of the resistor 51 changes from $I_o R$ to $2^{N-1} I_o R$. However, there are problems that the resistance value of the resistor 51 can not be too small in order to maintain the detecting accuracy of the current and the voltage of the power supply must be high in order to maintain the normal operation if the voltage drop of $2^{N-1} I_o R$ is produced across the resistor 51. It is desirable to solve such problems since they are not desirable in view of the withstanding voltage or the maximum voltage and the power consumption when realized by the integrated circuits.

Further embodiments of the present invention where such problems are solved and operation is made in low voltage and low power consumption will be explained with reference to FIGS. 9–12.

These embodiments may be achieved by changing the value of the resistor for detecting current in response to the magnitude of the compared currents, so that the terminal voltage of the resistor is maintained substantially constant and the voltage may be small even if comparing large currents.

For clarification of explanation, the following embodiments will show in the case where the binary weighted current up to N=3 or $2^2 I_o$. However, it can be achieved in the same manner in the case of N=2 and N>3.

Figure 9:
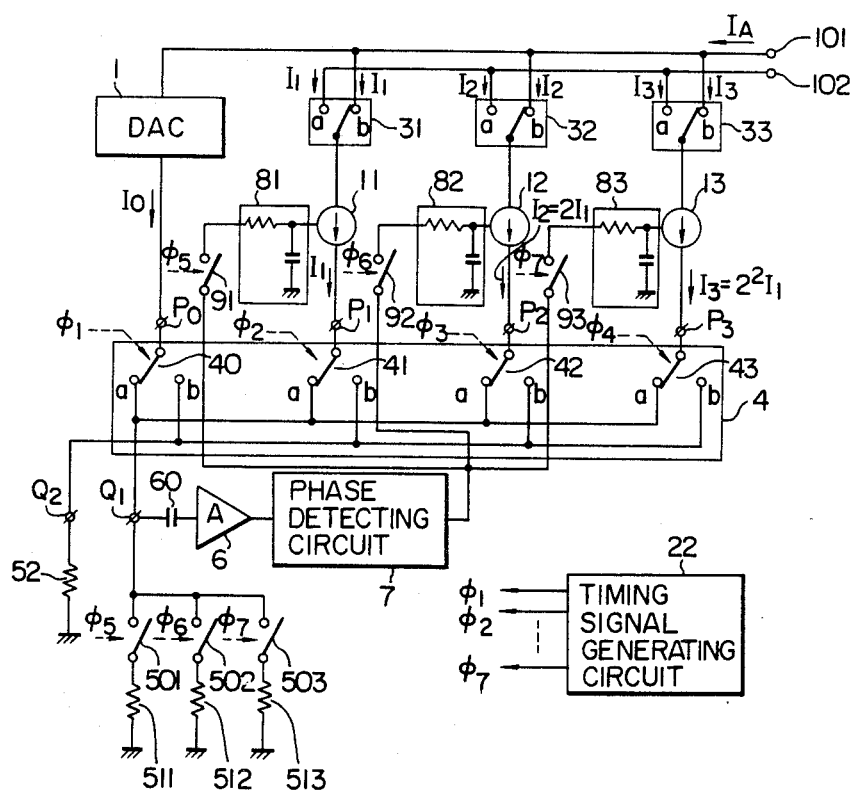
FIG. 9 is a circuit diagram of DAC according to a fourth embodiment of the present invention.

FIG. 9 shows a circuit diagram of a fourth embodiment according to the present invention, which corresponds to the case of N=3. In FIG. 9, like reference numbers as those of FIG. 6 indicate like constituents or parts. A current detecting resistance circuit (corresponding to the resistor 51 of FIG. 6) connected to the output terminal $Q_1$ of the change-over switch circuit 4 is composed of a predetermined number of switches 501–503 corresponding to N (3 in FIG. 9) and resistors 511–513 connected in series to the respective switches. The resistors 511–513 have values of R, 1/2R and $1/2^2 R$, respectively. The switches 501, 502 and 503 are opened and closed depending on the polarity of the timing signals $\phi_5$, $\phi_6$ and $\phi_7$, respectively. Other circuit constitution is the same as that of FIG. 6. Since the currents $I_o$ and $I_1$ alternately flow through the current detecting resistor circuit when the switch 91 is closed by the timing signal $\phi_5$ in the time period $T_1$, the switch 501 is closed to connect the resistor 511 having a value of R as a detecting resistor. In the following time period $T_2$, since the switch 92 is closed by the timing signal $\phi_6$ to compare the currents $I_o + I_1$ and $I_2 (= 2I_1)$, the switch 502 is closed by $\phi_6$ to connect the detecting resistor 512 having a value of 1/2R. Further, in the following time period $T_3$, since the switch 93 is closed by $\phi_7$ to compare the currents $I_o + I_1 + I_2$ and $I_3 (= 2^2 I_1)$, the switch 503 is closed by $\phi_7$ to connect the detecting resistor 513 having a value of $1/2^2 R$. In such a manner, selection of the resistance value of the detecting resistor depending on the value of the compared current cause all the voltage drop to be $I_o R$. Although the embodiment shows the case of N=3, it can be expanded to obtain the binary weighted current up to $2^{N-1}$ while maintaining the voltage drop of the detecting resistor constant if N numbers of resistors each having a value of $1/2^{n-1} R$ (n=1, 2, ..., N) are provided. If the dummy resistor 52 has a smaller value than $1/2^{N-1} R$, there is no problem about the voltage drop due to this resistor. Since the voltage drop is constant in the circuit constitution of FIG. 9, the constant accuracy for the current ratio can be assured and the detecting accuracy is not reduced.

Figure 10:
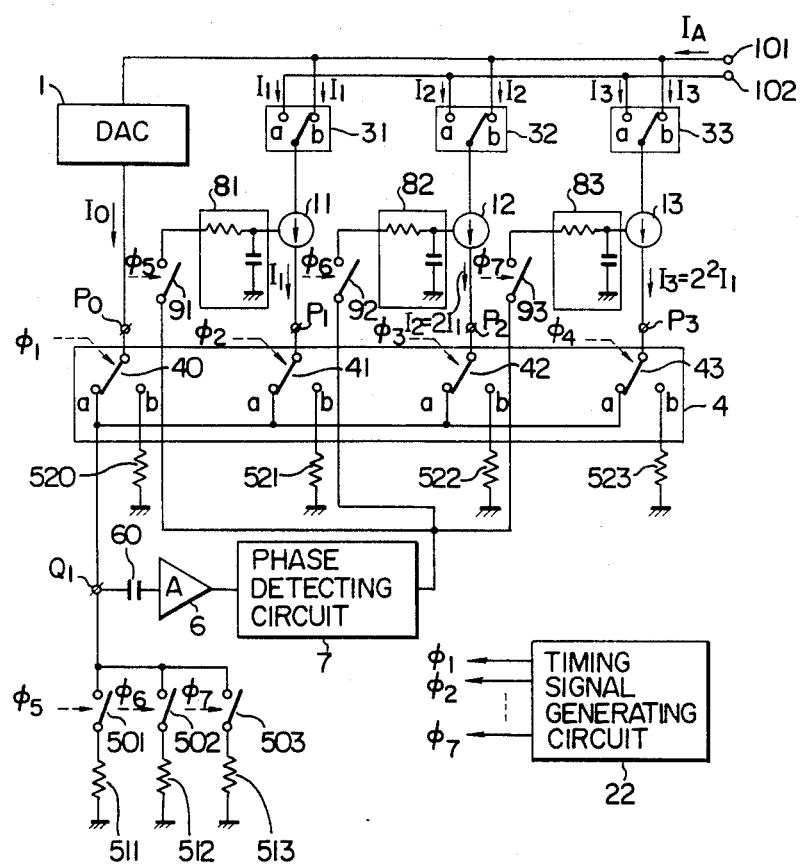
FIG. 10 is a circuit diagram of DAC according to a fifth embodiment of the present invention.

Furthermore, when the output resistances of the current sources 11–13 are not enough large and there is probability that the current sources 11–13 are affected by the load of the detecting resistor or the dummy resistor, as shown in FIG. 10, the terminals b of the change-over switches 10–43 in the change-over switches 40–43 in the change-over switch circuit 4 are not commonly connected to each other and separately connected to the respective dummy resistors 520–523, which have values of R, R, R/2 and $R/2^2$ (generally R and $1/2^{n-1} R$ (where n=1, 2, ..., N)), respectively.

Figure 11:
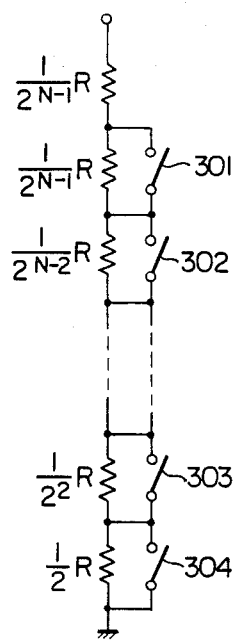
FIG. 11 is a partial circuit diagram of DAC according to a sixth embodiment of the present invention.

In FIGS. 9 and 10, N numbers of resistors having a resistance value of $1/2^{n-1} R$ (where n=1, 2, ..., N) are used and connected in parallel with each other through the switches so that the voltage drops are maintained constant. However, it will be apparent to obtain the same effect by providing serially connected resistors, as shown in FIG. 11, having terminals of $1/2^{N-1} R$, $1/2^{N-1} R$, $1/2^{N-2} R$, ..., R/2, between which switches 301–304 are disposed in parallel with the resistors to selectively short-circuit the resistors.

In this case, the relative error $\Delta I_i/I_i$ of the i-th current $I_i$ is given by the equation (5), if $I_i$ is composed of a fixed part ($I_{si}$) independent on the output voltage $V_{gi}$ of the low-pass filter circuits 81–83 and a changing part ($g_{mi} \cdot V_{gi}$) due to the output voltage $V_{gi}$ as given by the equation (4):

$$I_i = I_{si} + g_{mi} \cdot V_{si} \tag{4}$$

$$\Delta I_i/I_i \cong (1 - I_{si}/I_i)/(A \cdot \alpha \cdot \beta \cdot g_{mi} \cdot R_i) \tag{5}$$

where A, α and β are gains of the alternating current amplifier circuit 6, the phase sensitive detector 7 and the low-pass filter circuits 81–83, respectively, and $R_i$ is the value of the detecting resistor. Since $R_i$ changes to $1/2^{i-1}R$ depending on the magnitude of the binary weighted current $I_i$, the equation (5) is given by:

$$\Delta I_i/I_i = 2^{i-1}(1 - I_{si}/I_i)/(A \cdot \alpha \cdot \beta \cdot g_{mi} \cdot R) \qquad (6)$$

If the matching degree $(1 - I_{si}/I_i)$ with no feedback is always constant, the relative error is maximum at the most significant bit MSB or $I_n$ having a maximum weight. It is desirable to design $A \cdot \alpha \cdot \beta \cdot g_{mi}$ so that the relative error is sufficiently small at MSB.

However, since the open loop gain becomes large unnecessarily in order to enlarge $R_i$ when the compared current is small, there is possibility that the stability of the feedback circuit and the saturation of the alternating current amplifier 6 due to noise cause trouble.

Figure 12:
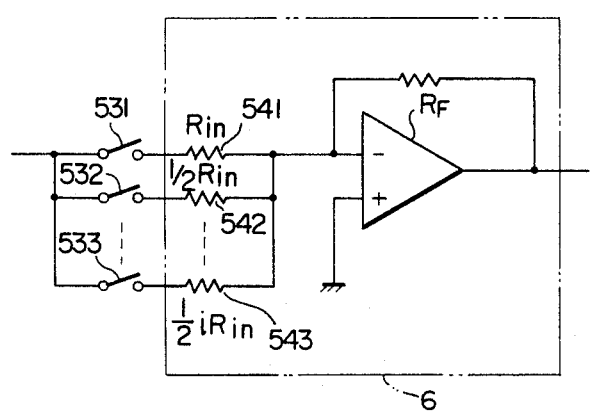
FIG. 12 is a partial circuit diagram of DAC according to a seventh embodiment of the present invention.

FIG. 12 shows a partial circuit diagram of a further embodiment according to the present invention, where the above problem are solved.

FIG. 12 shows a circuit diagram of the alternating current amplifier only. Other circuit constitutions is the same as in FIG. 9 or 10. In this embodiment, the gain of the amplifier 6 is changed depending on the magnitude of the detecting resistor $R_i$. A predetermined number of switches 531–533 corresponding to N and resistors 541–543 connected in series to the respective switches and which have resistance values of $R_{in}$, $1/2R_{in}$ and $1/2_2 R_{in}$ (generally $1/2_{i-1} R_{in}$; $i = 1 - N$), respectively, are connected in parallel between the capacitor 60 and the amplifier 6. The switches 531–533 are operated depending on the magnitude of the detecting resistor $R_i$ so that the gain of the amplifier is equal to $A_i = -2^{i-1} \cdot R_F/R_{in}$ when $I_i$ is detected. The switches 531–533 are controlled by the timing signals $\phi_5 - \phi_7$ for controlling the switches 501–503. By using such a circuit constitution, the open loop gain $A \cdot \alpha \cdot \beta \cdot g_{mi}$ becomes constant as $R_F \cdot \alpha \cdot \beta \cdot g_{mi} \cdot R/R_{in}$.

Further, the mutual conductance $g_{mi}$ of the current source 11–13 may be given binary weight instead of changing the gain of the amplifier 6. Namely, if the mutual conductance $g_{mi}$ of the current source for $I_i$ is given by:

$$g_{mi} = 2^{i-1} \cdot g_m (\text{where } i = 1, 2, \ldots, N) \qquad (7)$$

the open loop gain becomes constant as follows:

$A \cdot \alpha \cdot \beta \cdot g_m \cdot R$

As described above, addition of the resistors and the switches can make constant the voltage drop across the resistor for detecting the binary weighted current with high accuracy while maintaining the detecting accuracy of the current constant. Therefore, DAC with high accuracy is realized and suitable for the integrated circuits with low supply voltage and low power consumption.

In DAC according to the present invention, since the currents are switched by the change-over switch circuit 4, the switching noise appears on the output terminal 101, resulting in reduction of accuracy.

Thus, operation will be made to a further embodiment where the influence of the switching noise is reduced. In order to reduce the influence of the switching noise, it can be achieved by simultaneously switching the change-over switch circuit 4 for switching the current to detect the difference and the switch 31 which is switched by the digital input signal and completing the switching operation of the switches in the change-over switch circuit 4 until the output 101 of DAC becomes steady. The switching noise of the switch 31 which is switched by the digital input signal, or what is generally called as glitch, can be reduced by adding a sample-and-hold circuit to the output terminal 101 to maintain the sample-and-hold circuit in the hold mode during a certain period (until the glitch disappears) from just before the switch 31 is switched. Switching of the switches in the change-over switch circuit 4 may be also controlled when the sample-and-hold circuit added to the output terminal 101 is in the hold mode.

Figure 13:
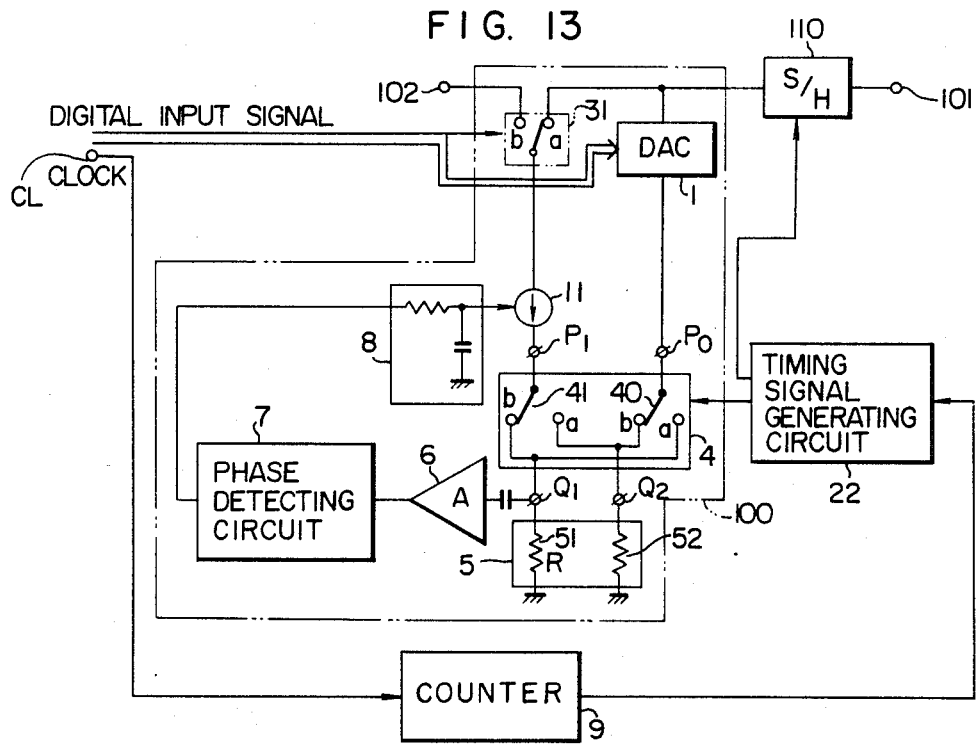
FIG. 13 is a circuit diagram of DAC according to an eighth embodiment of the present invention.

FIG. 13 shows a further embodiment of the present invention in which the switching noise is reduced and a clock signal synchronized with the digital input signal is added. In FIG. 13, the reference number 100 designates a basic part of DAC according to the present invention. The basic part in FIG. 13 is depicted with the circuit constitution of the embodiment of FIG. 2a. However, it may be attained with any circuit constitution in the above-described embodiments. This is the same as in the following embodiments. Since the clock CL is in synchronism with the digital input signal in the embodiment in FIG. 13, the output of the clock CL is divided by a counter 9 having a proper frequency dividing ratio into a frequency suitable for switching of the switches in the change-over switching circuit 4 to operate the timing signal generating circuit 22. Thus, when the switches in the change-over switch circuit are switched, the switch 31 is switched by the digital input signal, namely the output of DAC is changed. The noise at this time can be removed by making the sample-hold circuit 110 as deglitcher added to the output terminal 101 in the hold mode.

Figure 14:
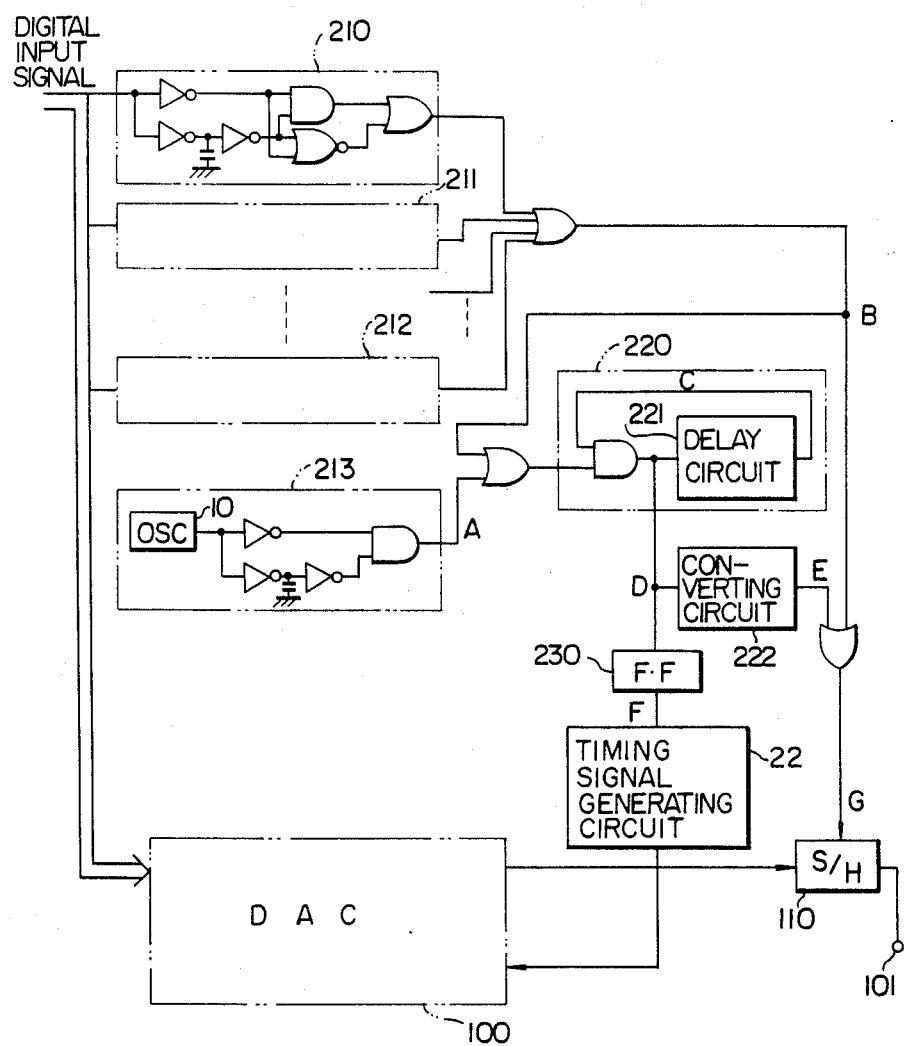
FIG. 14 is a partial circuit diagram of DAC according to a nineth embodiment of the present invention.

Further, FIG. 14 shows a further embodiment in which the synchronous clock as shown in the embodiment of FIG. 13 is not added. This is achieved by switching the switches in the change-over switch circuit in synchronism with the timing when the digital input signal is switched. If the digital input signal does not change for a long time, it may be complemented by the internal clock.

Figure 15:
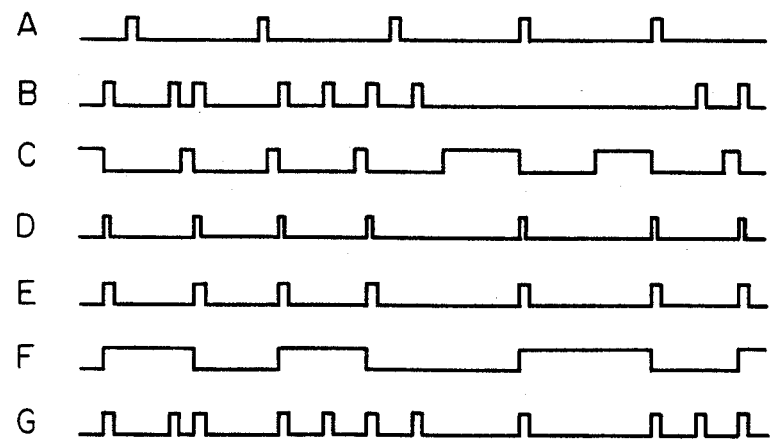
FIG. 15 is a timing chart for explaining DAC of FIG. 14.

FIG. 15 shows a timing chart of each portion of FIG. 14. The digital input signal is supplied to DAC 100. When the digital signal is changed by input signal change detecting circuits 210–212 (by way of example, a combination circuit of a delay circuit, AND circuits and NOR circuits are shown) provided in each bit of the digital input signal, namely when the output of DAC 100 changes, a signal B is produced to make the sample-hold circuit 110 in the hold mode. Once the signal B passes through an inhibit-signal generator 220 (by way of example, this circuit is composed of a delay circuit 221 such as a counter or a multivibrator and an AND circuit), the signal B is inhibited by a signal c to pass through the circuit during a certain period. A signal D is produced by the signal B caused by the switching of the first digital signal after release of the inhibition to set or reset a flip-flop 230 the output signal F of which operates the timing signal generating circuit 22. Consequently, since the error detecting switches in DAC 100 is switched, the time when the switches are switched is coincident with the time when the output of DAC 100 is changed by the change of the digital input signal. On the other hand, when the output of DAC is changed, the sample-hold circuit 110 becomes in the hold mode by the signal B to remove the switching noise.

Further, the digital input signal does not change for a long time, the signal D is produced from the inhibit-signal generator by the output signal A of a clock generating circuit 213 (by way of example, this circuit is composed of an oscillating circuit 10, a delay circuit and an AND circuit) to operate the flip-flop 230 and the timing signal generating circuit 22. Consequently, although the switching noise is produced since the error detecting switches operate, this influence is avoided by making the sample-hold circuit 110 to the hold mode by the signal E during this period. In FIG. 14, the reference number 222 is a circuit for converting a narrow pulse (signal D) generated from the inhibit-signal generator into a wide pulse having the same width as the control signal of the sample-hold circuit. If the digital input signal changes just after this time since the inhibit-signal generator operates at this time, the flip-flop 230 and the timing signal generating circuit 22 do not operate during a certain period and the timing signal generating circuit operates at a substantially constant interval. By suitably selecting the inhibit period of the inhibit-signal generator 220, the switching frequency of the switches can be suitable for the feedback circuit system. Although the switching frequency changes, there is no problem if the gain of the feedback system is large.

Figure 16:
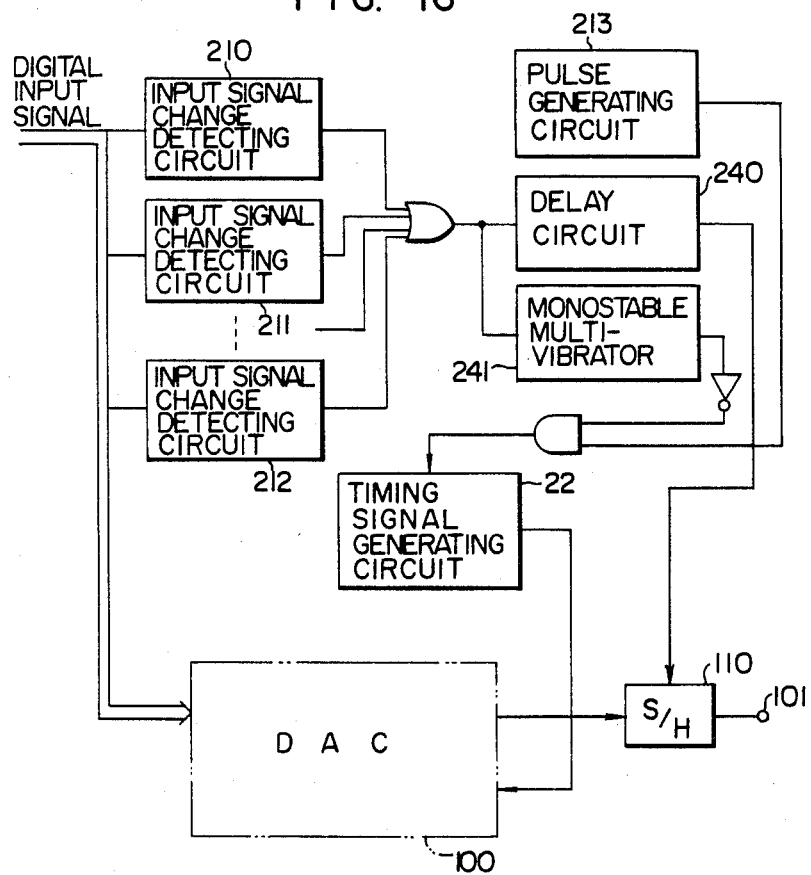
FIG. 16 is a partial circuit diagram of DAC according to a tenth embodiment of the present invention.

Next, FIG. 16 shows an embodiment where the sample-hold circuit is made to the sample mode to sample the output value of DAC just after the digital input signal changes and otherwise the sample-and-hold circuit is made to the hold mode. The change of the digital input signal is detected by the detecting circuits 210–212 when the signal is switched, and when the change is detected, the signal is delayed by a delay circuit 240 later than the switching time. When the output of DAC becomes steady, the sample-hold circuit 110 is made to the sample mode to sample the output of DAC 100. On the other hand, the switching of the error detecting switches is made by operating the timing signal generating circuit 22 by the pulse generating circuit 213 for generating pulses at a certain period. However, the output of the pulse generating circuit 213 is not supplied to the timing signal generating circuit 22 by a monostable multivibrator 241 or the like during the time when the sample-hold circuit is in the sample mode so that the switching of the switches is not made. Since the switching of the error detecting switches in DAC 100 is made only when the sample-hold circuit 110 is in the hold mode, the influence does not appear on the output.

Figure 17:
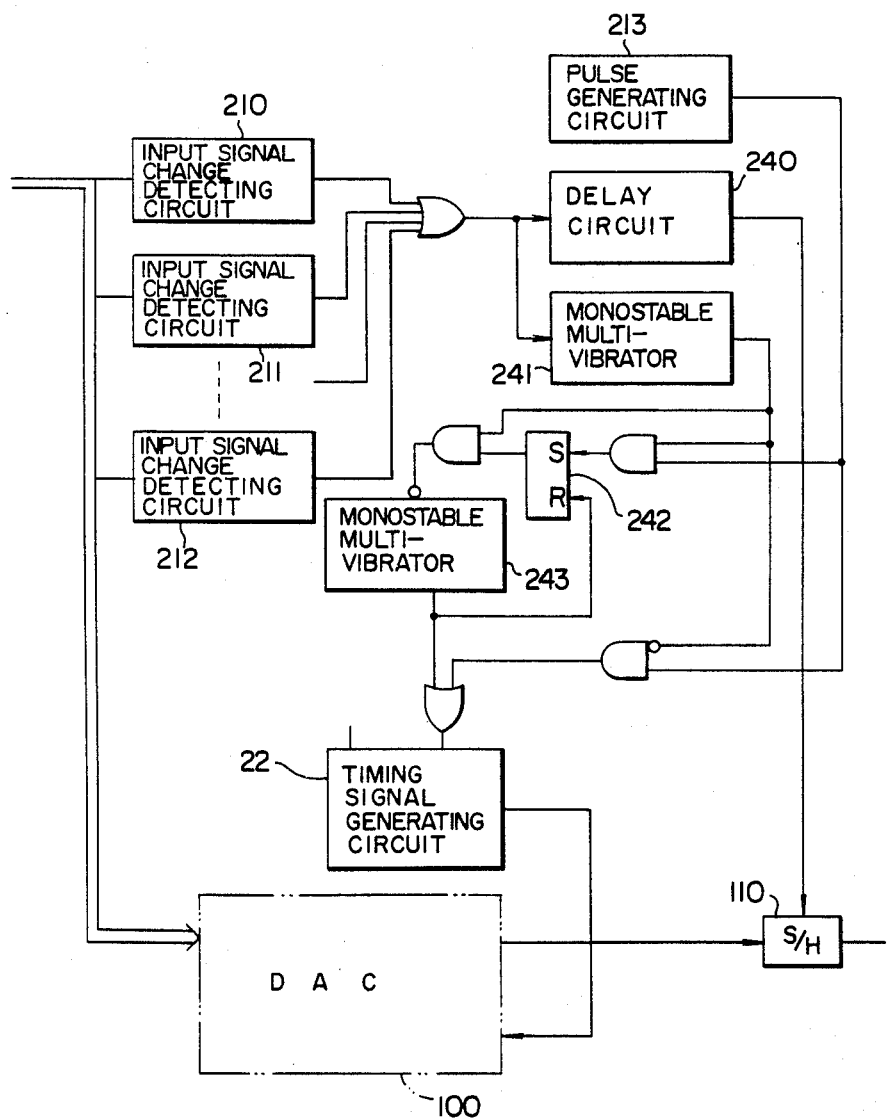
FIG. 17 is a partial circuit diagram of DAC according to an eleventh embodiment of the present invention.

In the embodiment shown in FIG. 16, when the sample-hold circuit 110 is in the sample mode, the switching of the error detecting switches is not made until the next pulse generation of the pulse generating circuit 213. FIG. 17 shows a further embodiment where the switching of the switches is made just after the sample-circuit becomes in the hold mode when the switching timing of the switches coincides to the sample mode. Namely, when the output of the pulse generating circuit 213 coincides to the output of the monostable multivibrator 241 which indicates a constant period (from the time when the sample-hold circuit 110 becomes to the sample mode to the time when it returns to the hold mode) just after the digital input signal changes, RS flip-flop 242 is set and when the sample-circuit 110 becomes to the hold mode a pulse is supplied to the timing signal generating circuit 22 by the monostable multivibrator 243 so that the switching of the error detecting switches is made. On the other hand, at this time, RS flip-flop 242 is reset. Other constitution and operation are the same as those in FIG. 16.

As described above, the timing when the noise of the switches for comparing two or more currents appears on the output is synchronized with the timing when the output of DAC is changed by the digital input signal or coincides to the hold period of the sample-hold circuit added to the output terminal of DAC, so that the switching noise does not appear on the output seemingly and the D-A converter with higher accuracy can be realized.

We claim:

1. A digital-to-analog converter comprising a digital-to-analog converting means for converting predetermined lower bits of a digital input signal into an analog current which has an additional output, the current thereof being fixed to a reference value, n ($n \geq 1$) numbers of current sources designated depending on the digital input signal of which said predetermined lower bits are removed, means for setting the output current value of at least one of said current sources by comparing the output current values with said reference value of said additional output so that the value is equal to a predetermined magnitude which is twice the value of a current controlled by the most significant bit at said digital-to-analog converting means, and means for adding the output current of said current source designated by said digital input signal and the output current of said digital-to-analog converting means to produce the analog signal corresponding to said digital input signal, wherein said setting means comprises control means for generating a control signal depending on the difference between the respective output current values of said current sources and said maximum value so that the respective output current values of said current sources become equal to said maximum value sequentially and supplying said current sources with said control signal, wherein said control means comprises current detecting means for alternately detecting the respective output current value of said n numbers of current sources and said maximum value and means for detecting a low frequency component of the output of said current detecting means, the output of which is said control signal, wherein said current detecting means comprises a timing signal generating circuit for generating a predetermined timing signal a first switch circuit including (n+1) numbers of first terminals composed of n numbers of terminals connected to said n numbers of current sources and a terminal connected to said additional output of said digital-to-analog converting means and two second terminals, and first and second resistance circuits connected to said two second terminals, respectively, said timing signal being supplied to said first switch circuit to sequentially select one of said n number of terminals every predetermined time period within a cycle time determined by said timing signal and to alternately connect the selected one of said n numbers of terminals and said terminal connected to said digital-to-analog converting means with said two second terminals, respectively, in each time period, whereby said first switch circuit sets up the above connecting pattern between said (n+1) numbers of first terminals and said two second terminals, and wherein said means for detecting said low frequency component comprises a capacitor connected to one of said second terminals, an amplifier circuit connected to said capacitor, a phase sensitive detector connected to said amplifier circuit, n numbers of low-pass filter circuits connected to said n numbers of current sources, respectively, and a second switch circuit for selectively connecting between said phase sensitive detector and said n numbers of low-pass filter circuits, said timing signal being supplied to said second switch circuit from said timing signal generating circuit to connect the low-pass filter circuit connected to the current source connected to said selected first terminal and said phase sensitive detector.

2. A digital-to-analog converter according to claim 1 wherein said means for detecting the low frequency component is made for detecting a low frequency component of a signal obtained from said first resistance circuit as a voltage drop.

3. A digital-to-analog converter comprising a digital-to-analog converting means for converting predetermined lower bits of a digital input signal into an analog current which has an additional output, the current thereof being fixed to a reference value, n (n≧1) numbers of current sources designated depending on the digital input signal of which said predetermined lower bits are removed, means for setting the output current value of at least one of said current sources by comparing the output current values with said reference value of said additional output so that the value is equal to a predetermined magnitude which is twice the value of a current controlled by the most significant bit at said digital-to-analog converting means, and means for adding the output current of said current source designated by said digital input signal and the output current of said digital-to-analog converting means to produce the analog signal corresponding to said digital input signal, wherein said setting means comprises control means for producing a control signal so that the respective output current values of said current sources become sequentially equal to said maximum value of the binary weighted current value on the basis of the difference between sums of the output current value of one of said n numbers of current sources and said maximum value or said maximum value and the output current value of at least one of said current sources to supply said current source with said control signal, wherein said control means comprises current detecting means for alternately detecting the respective output current values of said n numbers of current sources and said maximum value of the binary weighted current value and means for detecting a low frequency component of the output of said current detecting means, of which an output signal being said control signal, wherein said current detecting means comprises a timing signal generating circuit for generating a predetermined timing signal, a first switch circuit including (n+1) numbers of first terminals composed of n numbers of terminals connected to said n numbers of current sources respectively and a terminal connected to said digital-to-analog converting means and two second terminals, and first and second resistance circuits connected to said two second terminals, respectively, said timing signal beign supplied to said first switch circuit to sequentially select one of said n numbers of terminals within a cycle time determined by said timing signal, to alternately connect each of the selected first terminal and the first terminals connected to said digital-to-analog converting means with each of said second terminals within each time period, and to connect the input terminal selected prior to said selected input terminal with the same output terminal as the first terminal connected to said digital-to-analog converting means within said cycle time, whereby said first switching circuit sets up the above connecting pattern between said (n+1) numbers of first terminals and said two second terminals, and wherein said means for detecting said low frequency component comprises a capacitor connected to one of said second terminals, an amplifier circuit connected to said capacitor, a phase sensitive detector connected to said amplifier circuit, n numbers of low-pass filter circuits connected to said n numbers of current sources, and a second switch circuit for selectively connecting between said phase sensitive detector and said n numbers of low-pass filter circuit, the timing signal being supplied to said second switch circuit from said timing signal generating circuit to connect said low-pass filter circuit connected to the current source connected to the selected first terminal and said phase sensitive detector within each predetermined time period.

4. A digital-to-analog converter according to claim 3 wherein said means for detecting low frequency component is means for detecting a low frequency component of the signal obtained from said first resistance circuit as a voltage drop.

* * * * *